US 6,707,935 B2

(12) United States Patent
Kramer

(10) Patent No.: US 6,707,935 B2
(45) Date of Patent: Mar. 16, 2004

(54) HIGH SECURITY FLASH MEMORY AND METHOD

(75) Inventor: Alan Kramer, Alameda, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/188,791

(22) Filed: Jul. 2, 2002

(65) Prior Publication Data

US 2002/0164057 A1 Nov. 7, 2002

Related U.S. Application Data

(62) Division of application No. 09/219,549, filed on Dec. 22, 1998, now Pat. No. 6,442,286.

(51) Int. Cl.[7] .................................................. G06K 9/00
(52) U.S. Cl. ...................................... 382/124; 713/186
(58) Field of Search ........................ 382/115–118, 124, 382/125; 365/225.7; 713/182, 186; 356/71; 902/5–6; 235/380, 382, 382.5; 361/760; 705/14

(56) References Cited

U.S. PATENT DOCUMENTS

| 4,993,068 A | | 2/1991 | Piosenka et al. ............ 713/186 |
| 5,144,680 A | * | 9/1992 | Kobayashi et al. ......... 382/124 |
| 5,544,111 A | | 8/1996 | Berthozat et al. ........ 365/225.7 |
| 5,815,252 A | | 9/1998 | Price-Francis ............... 356/71 |
| 6,028,773 A | * | 2/2000 | Hundt ........................ 361/760 |
| 6,144,757 A | | 11/2000 | Fukuzumi ................... 382/124 |
| 6,266,647 B1 | * | 7/2001 | Fernandez .................... 705/14 |
| 6,320,394 B1 | | 11/2001 | Tartagni ..................... 324/662 |

OTHER PUBLICATIONS

Kramer, A. et al., FP 12.6: "1.5TXPS Convolver Using 5b Analog Flash for Real–Time Large–Kernel Image Filtering," TD: Low–Voltage and Multi–Level Techniques/Paper FP 12.6, SGS–Thomson Microelectronics, Berkeley, CA, pp. 196–197, *1998 IEEE Int'l Solid–State Circuits Conference*.

P.L. Rolandi et al., SA 21.2: 1M Cell 5b/Cell Analog Flash Memory for Digital Storage, Memory: NV and Embedded/Paper SA 21.2, SGS–Thomson Microlectronics, Agrate Brianza, Italy, pp. 334–335, *1998 IEEE Int'l Solid–State Circuits Conference*.

(List continued on next page.)

*Primary Examiner*—Samir Ahmed
*Assistant Examiner*—Vikkram Bali
(74) *Attorney, Agent, or Firm*—David V. Carlson; Lisa K. Jorgenson

(57) ABSTRACT

An integrated circuit includes a sensor that reads a fingerprint and provides data corresponding to the fingerprint to a computation engine coupled to the sensor. The computation engine compares the data to stored data and enables a smart card coupled to the computation engine when the data and the stored data match. The computation engine may include an array of flash memory cells arranged in pairs of rows, where flash memory cells in any one row have sources coupled to a common row line and a plurality of conductance mode neurons each having first and second inputs coupled to first and second row lines forming a respective pair of rows. The neurons are coupled to the flash memory cells through a buffer circuit sets a drain-source voltage of the flash memory cells in the row pair coupled to the neuron.

13 Claims, 6 Drawing Sheets

OTHER PUBLICATIONS

Kramer, A. et al., "Flash Based Programmable Nonlinear Capacitor for Switched Capacitor Implementations of Neural Networks," SGS–Thomson Microlectronics, Agrate Brianza, Italy, pp. 17.6.1–17.6.4, *1994 IEEE*.

Fabrizio, V. et al., "Low–Power, Low Voltage Conductance–Mode CMOS Analog Neuron," SGS–Thomson Microlectronics, Agrate Brianza, Italy, pp. 111–115, *1996 IEEE Proceedings of Micro Neuro '96*.

Alan H. Kramer, "Array–Based Analog Computation: Principles, Advantages and Limitations," SGS–Thomson Microlectronics, Agrate Brianza, Italy, pp. 68–79, *1996 IEEE Proceedings of Micro Neuro '96*.

Kramer, A. et al., "384 GCPS Convolver Using 5–bit Analog Flash for Real–Time Large Kernel Image Filtering," SGS–Thomson Microlectronics, Agrate Brianza, Italy.

* cited by examiner

HIGH SECURITY FLASH MEMORY AND METHOD

This application is a divisional of U.S. Ser. No. 09/219,549 filed on Dec. 22, 1998 now U.S. Pat. No. 6,442,286.

This application is related to: U.S. patent application Ser. No. 08/799,548, filed Feb. 13, 1997, now abandoned; U.S. Pat. No. 09/019,496, filed Feb. 5, 1998, and issued Nov. 20, 2001 as U.S. Pat. No. 6,320,394; and, U.S. application Ser. No. 08/802,658, filed Feb. 19, 1997, and issued May 22, 2001 as U.S. Pat. No. 6,236,741. The above-referenced patent applications are all assigned to STMicroelectronics.

BACKGROUND OF THE INVENTION

1. Field of the Invention

The present invention relates in general to flash memories and in particular to flash memories used for secured data applications.

2. Description of the Related Art

A number of new applications for electronic devices have emerged during the last several decades. Many of these include need for security of information stored in the electronic devices.

Some, such as automated bank teller machines, employ encryption engines, which may be compatible with the Data Encryption Standard ("DES") published by the U.S. Government. Others, such as secure telephone units, use a public key algorithm to exchange cipher keys that are then employed together with encryption techniques providing high enough data throughput to allow real-time voice or data communication. These technologies do not lend themselves to pocket-, purse- or wallet-portable consumer applications and may be of limited geographic use due to export restrictions.

"Smart cards" containing electronic circuitry are becoming increasingly popular as a way of transferring funds in exchange for goods or services. In some instances, a memory integrated circuit within the smart card is credited with a balance when funds are deposited, and the balance is decremented as the card is used while a credit is given in a separate account. In other instances, the card operates more as a debit or credit card, providing information that is then used to alter balances in two or more accounts external to the card. In either case, the owners of the card or the accounts or both have vested interests in the integrity of whatever system is used to safeguard the financial interests of the rightful owner of the affected funds, balances or accounts.

Different kinds of systems can be employed for verification of a user's identity for authentication of a transaction. In those systems where the user supplies some form of data (e.g., PIN), and the data is sufficient to provide access to something in which the user has a property interest, it is important to safeguard the data itself.

Numerous examples of electronic theft based on unauthorized use of identification codes exist. In many cases, people have had their telephone cards numbers and PINs observed while using a public telephone. The observer then places calls using the stolen data. Sophisticated thieves have picked cellular telephone identification codes from cellular telephone transmissions and then encoded semiconductor memory integrated circuits with the stolen codes, put the memory integrated circuits into cellular telephones and sold the telephones.

Requiring the user to enter a PIN via some publicly-accessible medium thus can present substantial security risks. Additionally, requiring the user to memorize and repeatedly provide a PIN presents noticeable nuisance value to the user. One approach to ensuring that the user of a given financial instrument is authorized to do so is to unobtrusively read an immutable or nearly-immutable physical characteristic of the user that also provides unique identification of that user contemporaneously with use of the instrument. However, data corresponding to the identifying characteristic then must be stored in some portion of the system that the instrument interacts with. When these data are read out from either the instrument or the system and then used to falsely authenticate a transaction, system security is compromised. Systems in which this can occur are likely to meet substantial marketplace challenges and are unlikely to win consumer confidence and market acceptance.

Enablement of a high degree of user autonomy is a highly desirable characteristic in many consumer instruments. As a result, portability coupled with widespread acceptance of the consumer instrument are strongly preferred. At the same time, both real-time operation and a high degree of data security are important characteristics.

BRIEF SUMMARY OF THE INVENTION

In one aspect, the present invention is capable of providing the security of fingerprint recognition together with the convenience of smart cards as a way of enabling transactions across a variety of consumer markets, together with permitting high geographic diversity. The manner in which the fingerprint recognition is carried out does not permit probing of a memory storing reference fingerprint data, and the binary nature of the output data does not permit information regarding the stored reference fingerprint data to be determined from a "trial and error" approach. In one aspect, the fingerprint recognition hardware disables or destroys access to the smart card portion of the invention when a predetermined number of unsuccessful attempts to enable the card for use have been attempted. Access to the stored fingerprint data may be disabled or destroyed in addition to or as an alternative to disabling or destroying access to the smart card portion of the invention.

DETAILED DESCRIPTION OF THE INVENTION

Figure 1:
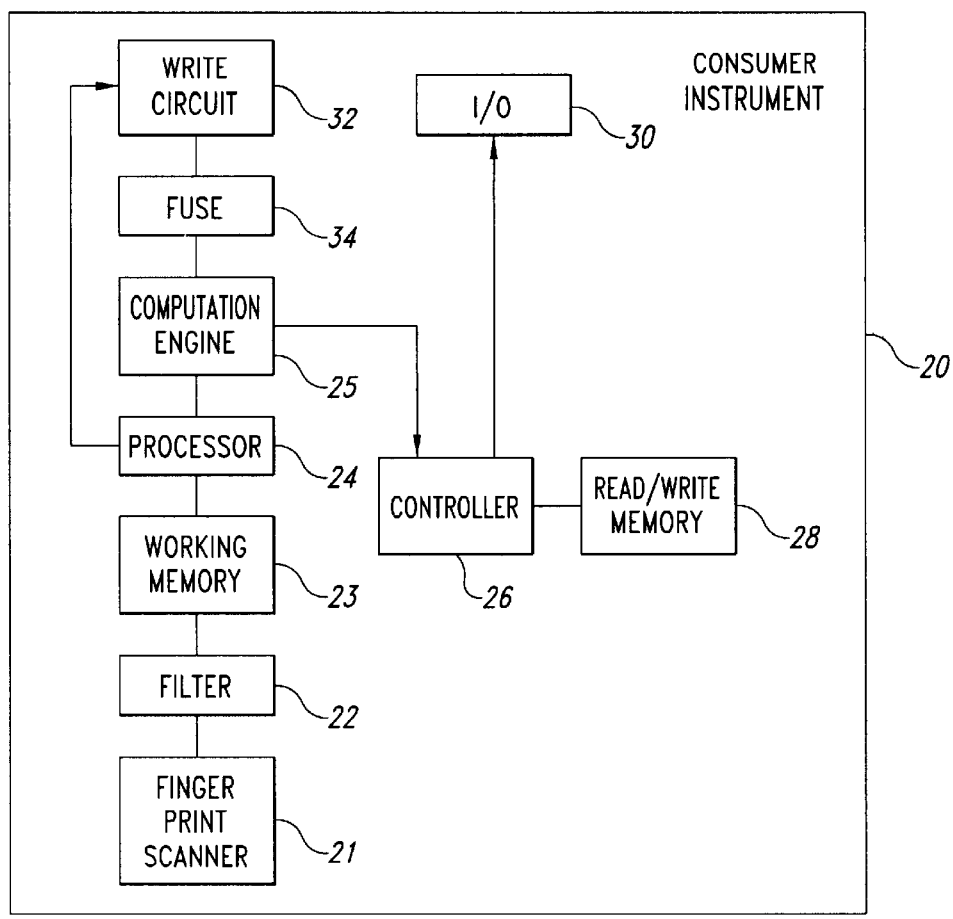
FIG. 1 is a simplified block diagram of a fingerprint sensor coupled to a computation engine in a consumer instrument, in accordance with an embodiment of the present invention.

FIG. 1 is a simplified block diagram of a module forming a consumer instrument 20 including a fingerprint sensor 21 coupled through a filter 22, a working memory 23 and a processor to a computation engine 25, in accordance with an embodiment of the present invention. The instrument 20 also includes a controller 26 having an input coupled to an output of the computation engine 25, a read-write memory 28 coupled to the controller 26 and I/O circuitry 30, all powered by some form of power supply. The power supply may include a battery or capacitor or may rely on a physical interconnection to an external source of power through the I/O circuitry 30.

The user of the instrument 20, which may be a smart card in accordance with one embodiment of the invention, places a chosen finger atop the fingerprint sensor 21 in conjunction with execution of a transaction, such as operation of a cellular telephone or purchase of consumer or other goods. The fingerprint sensor 21 reads data corresponding to a fingerprint and provides output data to the computation engine 25. The computation engine 25 compares the data from the fingerprint sensor 21 to previously-stored data and provides a GO or a NO GO signal to the controller 26. By providing only a binary output signal from the computation engine 25, the only information regarding the previously-stored fingerprint data available at the output of the computation engine 25 is whether it did or did not match the input data. As a result, exhaustive search (trying all possible input combinations) is the only way that the information available at the output of the computation engine 25 can only be used determine the previously-stored fingerprint data.

Exhaustive search techniques can be easily foiled by simply including a counter that determines the number of unsuccessful fingerprint reads that occur. In one embodiment, the number of unsuccessful fingerprint reads per unit time is monitored. When a predetermined threshold is exceeded, the controller 26 can initiate processes to erase all data stored in the instrument 20, to disable the fingerprint sensor 21 or the computation engine 25 or, in at least some instances, to signal appropriate authorities.

For example, if the I/O circuitry 30 of the instrument 20 is in data communication with a cellular telephone to effect an unauthorized call, the instrument 20 may initiate a call to a predetermined telephone number used to track this type of unauthorized transaction. Similarly, if the I/O circuitry 30 of the instrument 20 is in data communication with some form of financial network, similar distress signals may be transmitted.

In one embodiment, the consumer instrument 20 is programmed with one or more desired user fingerprints by taking fingerprint data using the fingerprint scanner 21, processing the data through the filter 22, working memory 23 and the processor 24. The processed fingerprint data are then written to nonvolatile memory (not shown in FIG. 1) within the computation engine 25 using a write circuit 32. Following verification of the fingerprint data written to the nonvolatile memory, the capability of the write circuit 32 to write data to the nonvolatile memory in the computation engine is disabled or destroyed, for example by blowing one or more fuses or antifuses 34 coupled between the write circuit 32 and the computation engine 25. Other techniques to disable the write circuit 32 may also be employed.

Figure 2:
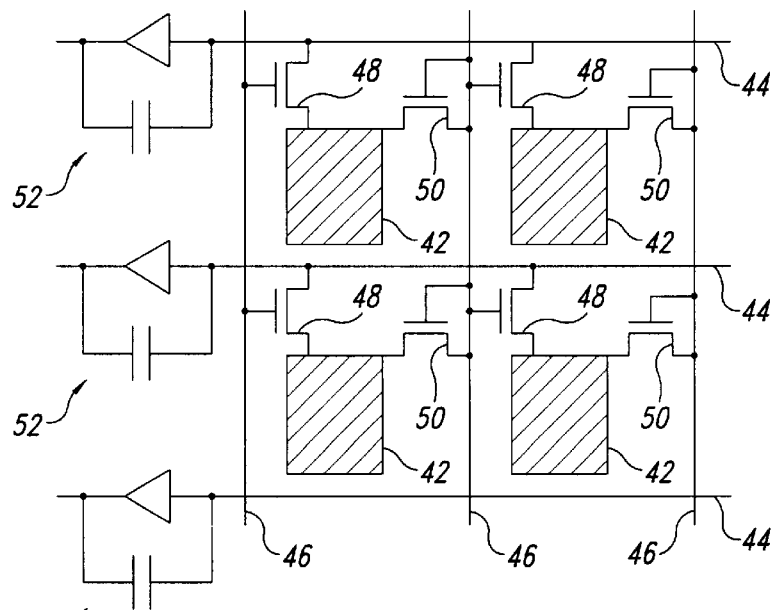
FIG. 2 is a simplified schematic diagram of an example of a capacitance sensing array for reading of fingerprint data by the fingerprint sensor of FIG. 1, in accordance with an embodiment of the present invention.

FIG. 2 is a simplified schematic diagram of an example of a capacitance sensing array 40 for reading of fingerprint data by the fingerprint sensor 21 of FIG. 1, in accordance with an embodiment of the present invention. The capacitance sensing array 40 may also be equipped with other types of sensors to detect certain kinds of unauthorized transactions. For example, the capacitance sensing array 40 may be equipped with temperature sensors, sensors to detect a pulse in the finger from which the fingerprint is being read or sensors to determine that the finger includes oxygenated blood (via spectral characteristics of the finger). These types of sensors can be used to try to ensure that the fingerprint that is being read is from a finger that is coupled to a living human being.

The capacitance sensing array 40 includes a series of capacitor plates 42 arranged along row lines 44 and column lines 46. The capacitor plates 42 may be addressed by enabling transistors 48 coupled between the capacitor plates 42 and a respective row line 44 and simultaneously enabling transistors 50 coupled between the capacitor plate 42 and a respective column line 46. The capacitor plate 42 that is located at an intersection of the respective row line 44 and the respective column line 46 is coupled to a charge integrator 52. By scanning the row lines 44 and the column lines 46 in a predetermined pattern, the entire array 40 may be read, one capacitor plate 42 at a time, to provide a fingerprint image for further processing and machine recognition or rejection.

An example of such a fingerprint sensor 21 is described in "Novel Fingerprint Scanning Arrays Using Polysilicon TFT's on Glass and Polymer Substrates" by N. D. Young et al., IEEE El. Dev. Lett., Vol. 18, No. Jan. 2, 1997, pp. 19–20. In one embodiment, the fingerprint sensor 21 described in this article is formed on an integrated circuit that also includes the computation engine 25. In one embodiment, the computation engine 25 is formed from a flash memory array configured to compare fingerprint data from the fingerprint sensor 21 with stored data in the flash memory array in a secure and efficient fashion.

More generally, the fingerprint sensor 21 operates according to any known principle—e.g., optical, capacitive, piezoelectric, ultrasonic, thermal—to obtain images (test images) of, say, 512×512 dots (pixels). As is described in co-pending U.S. patent application Ser. No. 08/802,658, filed on Feb. 19, 1997, the test images are filtered in the filter 22 of FIG. 1, depending on the operating principle of the fingerprint sensor 21. In some embodiments, the filter 22 may be a digital software filter and may be implemented within the processor 24. A nonvolatile memory within the computation engine 25 stores information relative to a number of images associated with the application in question (a relatively small number of images may be sufficient if the system is used as a personal key). Such reference information preferably comprises reference fingerprint images comprising a number of pixels having different gray levels (like the images detected by the fingerprint sensor 21), as well as information derived by processing the reference fingerprint images and for direct or indirect comparison with information derived from the test image to reduce the amount of processing required each time to identify a fingerprint.

A fingerprint includes dermatoglyphic features unique to the individual corresponding to the fingerprint and that are also readily recognizable. These dermatoglyphic features are scattered in a matrix of other dermatoglyphic features which may be equally unique but which are (at least to human interpreters) substantially less recognizable as being unique to the individual, such as an area including a number of parallel and locally straight ridges. Identification of an individual person through fingerprint recognition procedures tends to be based on identification of a predetermined number of highly recognizable dermatoglyphic features and on the spatial relationships between these features.

To begin with, a test image is acquired by the fingerprint sensor 21 and filtered by the filter 22 in a known manner to obtain as regular a gray scale image as possible. The filtered image, stored in the working memory 23, is processed by the processing unit 24 to define the coordinates (Xi,Yi) of significant points represented by the terminations, bifurcations and other features of the epidermal ridges, or so-called minutiae. Such processing to determine the significant points may be performed in any known manner, e.g., as indicated in the article "Automatic Fingerprint Identification", 1979, by Asai, Kato, Hoshino and Kiji. The resulting significant points are then stored in the working memory 23 and compared by the computation engine 25 with corresponding significant points in the reference image (extracted and stored beforehand using the same significant point extraction procedure as for the test image). In particular, each significant point in the test image with coordinates (Xi,Yi) is compared with all the significant points in the reference image with coordinates (Xj,Yj) to establish a local similarity between the regions centered about the significant points. The local region similarity check procedure is described in detail in the above-referenced U.S. patent application Ser. No. 08/802,658.

When an actual similarity is determined, the local region similarity check process generates a pair of significant points (one in the test image and one in the reference image) having a local similarity (in terms of gray tones) to the regions surrounding them, and the pairs of significant points are stored in the working memory 23. A check is then made to determine whether the local region similarity check has been repeated for all of the significant points in the test image. If it has not, it is repeated, and, when all the significant points in the image have been checked, a list of pairs of significant points is available.

For each pair of significant points so obtained, a coordinate translation and rotation from the test image to the reference image is defined to match a second pair of significant points within a given tolerance, so that, for each two pairs of significant points, a linear rotation-translation transformation is identified on which to match the test and reference fingerprint images.

Having identified a rotation-translation as described above, the matching points of the other pairs of significant points are determined. In other words, applying the defined rotation-translation, a count is made of the significant points in the test image matching the significant points with which they are paired in the reference image. If there are fewer than a predetermined number of matching pairs of significant points, the test and reference prints do not match, and the rotation-translation definition and match count procedure is repeated for another two pairs of significant points, and so on until a rotation-translation resulting in more than the minimum required number of matches is defined or until all the possible transformations have been checked. In the latter case, the prints are definitely considered non-matching, and the test and reference image comparison is terminated with a negative match output.

Conversely, in the event that at least the predetermined number of matching pairs of significant points are detected in the test and reference images, real matching of the prints is determined by appropriately comparing image segments connecting a first pair of significant points (one in the test image and one in the reference image) with all the other pairs of significant points, and by validating the first pair of significant points when a sufficient similarity is determined for at least a predetermined number of image segments as discussed above.

At this point, a check is made to determine whether the similarity of the segments has been determined for all the matching significant points. When it has not, then the real matching described above is repeated. When it has, a check is made to determine whether the number of validated matching significant points is greater than or equal to a predetermined threshold for a given rotation-translation to be considered valid. When the chosen rotation-translation is valid, the fingerprint is considered to be identified; when it is not considered valid, another rotation-translation is chosen and the process is repeated.

In one embodiment, calculation of the similarity of the regions surrounding two significant points, one in the test image with coordinates (Xi,Yi), and one in the reference image with coordinates (Xj,Yj) is performed as described below. Using the gray values of the test and reference images, a region including M×M points (e.g., 16×16) is defined about each test and reference point being compared. According to one aspect of the present invention, the similarity of these regions is determined by calculating the value of the integral norm of two surfaces $Si_t$ and $Sj_r$ defined as:

$$Si_t = \{x,y,z\} : z = \text{gray}(x,y) \qquad (Eq. 1)$$

where Xi−8≦x<Xi+8; Yi−8≦y<Yi+8 for the test image points, and $$Sj_r = \{x,y,z\} : z = \text{gray}(x,y) \qquad (Eq. 2)$$

where Xj−8≦x<Xj+8; Yj−8 ≦y<Yj+8 for the reference image points, and wherein gray(x,y) is the gray tone of the test or reference image at point (x,y).

The integral norm N of two surfaces $Si_t$ and $Sj_r$ equals:

$$N = \iint_{M \times M} |Sj_r(x,y) - Si_t(x,y)| \, dx \, dy \qquad (Eq. 3)$$

Since, in this case, the region of M×M points and the functions $Si_t$, $Sj_r$ which are used to compute the similarity are discrete, the double integral is converted into a double summation, and Eq. 3 becomes $$N = \Sigma\Sigma |Sj_r(x-Xi+Xj, y-Yi+Yj) - Si_t(x,y)| \qquad (Eq. 4)$$

where Xi−8≦x<Xi+8; Yi−8≦y<Yi+8.

Computing the above norm is particularly onerous in fingerprint recognition, which on average involves 100–150 significant points for each test and reference image, and wherein the coordinate of each significant point is definable within a tolerance of about five pixels (±2 in relation to the given coordinate) both horizontally and vertically. This means that, for each pair of significant points for comparison, 25 norms have to be computed, and the similarity verification requires 25×T×S calculations as per Eq. 4 (given T significant points in the test image and S significant points in the reference image). Even reducing the operations required for each pair of significant points to compute the norm in only 9 of the 25 coordinate tolerance points, computation time is still substantial and unacceptable in many applications.

Rapid and efficient computation of the above norm is possible using an array of analog flash cells. An example is described in "Flash-Based Programmable Nonlinear Capacitor for Switched-Capacitor Implementations of Neural Networks" by A. Kramer et al. in IEDM Tech. Dig. p. 17.6.1–17.6.4, December 1994.

In this example, the array of analog flash cells may be used to calculate the absolute difference between two values by connecting the source and drain regions of two flash cells to each other and to an input node of a charge integrator, supplying the gate terminal of a first cell with a voltage corresponding to the first value, memorizing in the same first cell, as the threshold voltage, the second value to be subtracted from the first, supplying the gate terminal of the second cell with a voltage complementary to that supplied to the first cell, and memorizing as the threshold voltage in the second cell a value complementary to the second value to be subtracted (see FIG. 3 in the above article). It is also possible to calculate the sum of the difference between pairs of values by connecting the output nodes of different pairs of cells supplied (as threshold and input voltages) with the pairs of values to be added (see FIG. 4 in the article, relative to calculating the Manhattan distance between two vectors).

Using the same principle, the above norm may be computed by parallel computing all the individual differences between the gray levels of pairs of corresponding points in the test and reference images to obtain the value of the norm directly at the output. One example of a flash cell array for computing the norm defined in Eq. 4 is described in the above-referenced U.S. patent application Ser. No. 08/802,658.

Figure 3A:
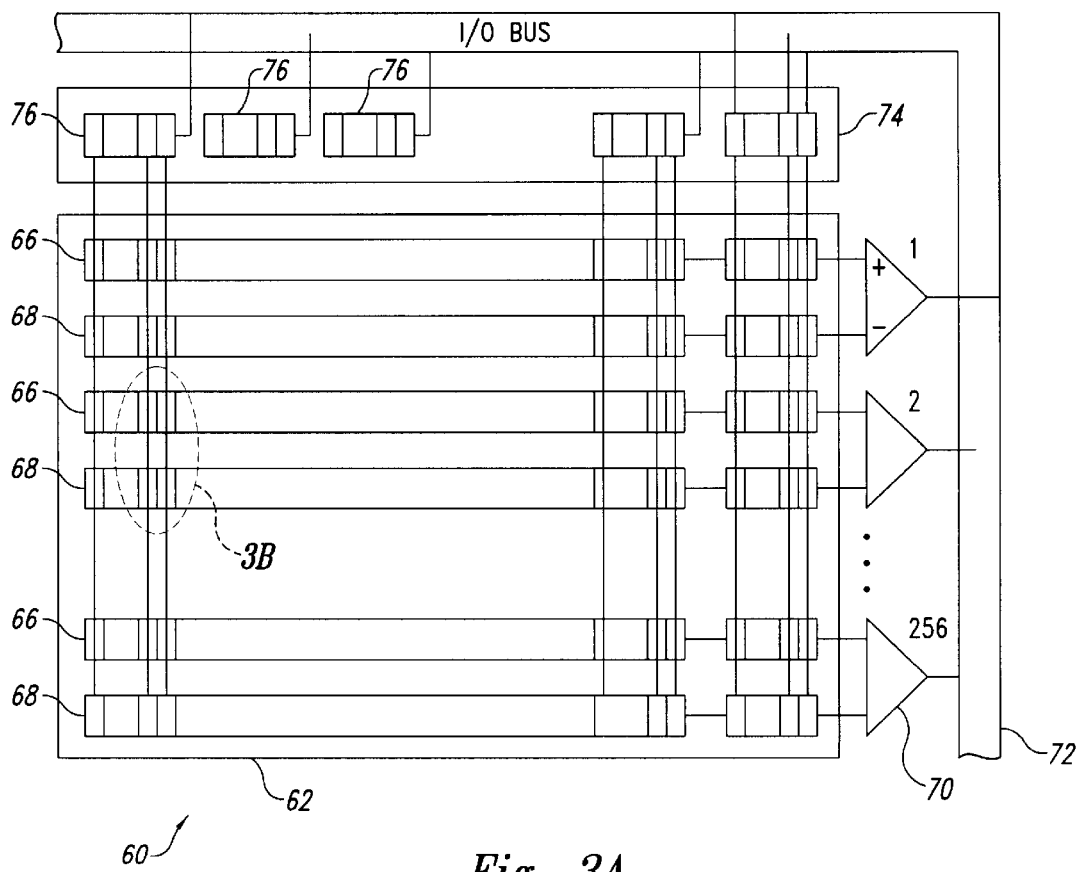
FIG. 3A is a simplified block diagram of the computation engine for the consumer instrument of FIG. 1.
Figure 3B:
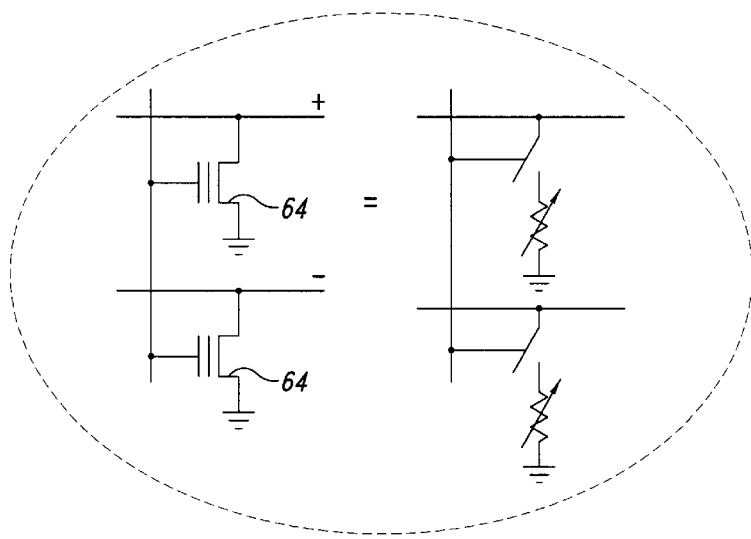
FIG. 3B is a simplified schematic diagram of equivalent circuits for the memory cells of FIG. 3A, in accordance with an embodiment of the invention.

FIG. 3A is a simplified block diagram of a flash memory processor 60 that can fulfill the functions of the computation engine 25 in the consumer instrument 20 of FIG. 1 and FIG. 3B is a simplified schematic diagram of equivalent circuits for the memory cells 64 of FIG. 3A, in accordance with an embodiment of the invention. The principles of operation of the embodiment of FIGS. 3–6 are described in "1.5XTPS Convolver using 5b Analog Flash for Real-Time Large-Kernel Image Filtering" by A. Kramer et al., ISSCC Paper FP12.6, pp. 196–197, February 1998 (IEEE Cat. No. 0-7803-4344-1/98).

The flash memory processor 60 of FIG. 3A includes an array 62 of flash memory cells 64 connected in interleaved rows 66 and 68. Each of the rows 66 is coupled to a first input of a conductance-summing neuron circuit 70, and a corresponding one of each of the rows 68 is coupled to a second input of the conductance-summing neuron circuit 70. This arrangement allows flash memory cells 64 in one row 66 to represent data having a first sign (e.g., positive) and flash memory cells 64 in the other row 68 to represent data having a second sign (e.g., negative). In one embodiment, 256 row pairs 66, 68 are coupled to a corresponding 256 neuron circuits 70, however, other numbers of rows 66 and 68 are possible. In one embodiment, the rows 66 and 68 each include one thousand bits of data storage, however, other sizes are possible for the rows 66, 68.

The flash memory processor 60 also includes an I/O bus 72 coupled to outputs of each of the neuron circuits 70 and to an input signal conditioner 74 that is also coupled to the flash memory cells 64. The input signal conditioner 74 may be formed from shift registers 76 that allow input signals from the I/O bus 72 to be latched. The shift registers 76 may be dynamically reconfigurable to permit the input signals to come from, for example, the preceding shift register 76, to allow for other input-path configurations.

Conductance mode operation of flash memory cells 64 and principles of operation of the flash memory processor 60 are discussed in "Low power, Low Voltage Conductance-Mode CMOS Analog Neuron" by V. Fabbrizio et al., pp. 111–115, and in "Array-Based Analog Computation: Principles, Advantages and Limitations" by A. Kramer, pp. 68–79, both appearing in Proc. MicroNeuro 1996 (IEEE Cat. No. 1086-1947/96).

Figure 4:
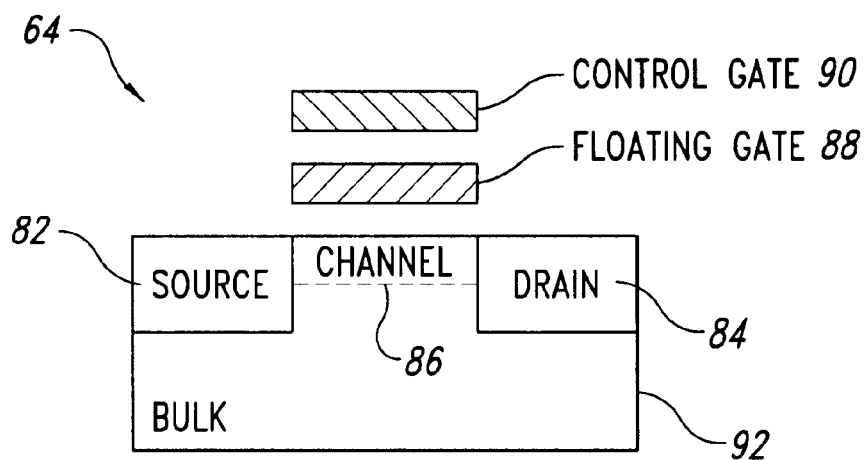
FIG. 4 is a simplified side view of a floating gate FET memory cell of the flash memory processor of FIG. 3A.
Figure 5:
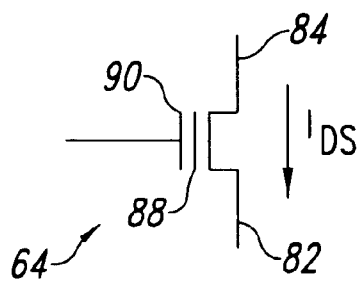
FIG. 5 is a simplified schematic diagram of the floating gate FET memory cell of FIG. 4, in accordance with an embodiment of the present invention.

FIG. 4 is a simplified side view of one of the flash memory cells 64 in the flash memory processor 60 of FIG. 3A, and FIG. 5 is a simplified schematic diagram of the flash memory cells 64 of FIG. 4, in accordance with embodiments of the present invention. The flash memory cells 64 includes a source 82, a drain 84, a channel 86 extending from the source 82 to the drain 84, a floating gate 88 and an externally-accessible control gate 90, all conventionally formed on a semiconductor substrate 92. The flash memory cell 64 is programmed to store a predetermined amount of charge on the floating gate 88 by application of suitable voltages to the control gate 90, the source 82 and the drain 84.

Application of a positive voltage to the control gate 90 and/or the drain 84 can cause electrons to tunnel through a dielectric layer separating the floating gate 88 from the channel 86. These electrons then charge the floating gate 88, altering a threshold voltage $V_T$ of the flash memory cells 64. The amount of charge that is stored on the floating gate 88 can later be measured by determining the threshold voltage $V_T$ of the flash memory cell 64, or the threshold voltage $V_T$ may be compared to an input voltage applied to the control gate 90. The more electrons that are stored on the floating gate 88, the more positive the threshold voltage $V_T$ will be.

Application of a suitable voltage to the control gate 90 can cause electrons stored on the floating gate 88 to tunnel out from the floating gate 88, thus erasing the data that were stored in the flash memory cell 64. Typically, a verify operation is employed at the beginning and the end of each programming operation to determine the status of the flash memory cell 64.

In the flash memory processor 60 of FIG. 3A, the flash memory cells 64 are initially programmed with analog values by storing charge on the floating gates 88 corresponding to a predetermined number of bits. For example, a 6-bit weight formed from 5 value bits and a sign may be programmed into a pair of flash memory cells 64 that are coupled to counterpart locations on a pair of the rows 66, 68 that are coupled to one of the neuron circuits 70.

In operation, the input signal conditioner 74 applies input digital signals to the control gates 90 of the flash memory cells 64. The input digital signals have one of two possible analog values, $V_{HI}$ and $V_{LOW}$. The analog values $V_{HI}$ and $V_{LOW}$ can be adjusted to modify dynamic range and precision. The programmed analog values are chosen so that one of the flash memory cells 64 in each pair is always off (i.e., has a programmed threshold voltage $V_T$ that is greater than $V_I$) and the other is only ON when the input is a logical "1" (i.e., $V_{LOW} < V_T < V_{HI}$). As a result, because $V_T$ is programmable, each of the flash memory cells 64 acts as a programmable conductance that is switched in or out of the conductance summing row line 66 or 68 by a digital input signal. The sources 82 of all of the flash memory cells 64 in one row are coupled to the associated row line 66 or 68.

This technique utilizes common source lines in each row line 66 or 68 for conductance summing of each of, for example, 256 pairs of computational rows 66 or 68 each having 1,000 one-bit inputs. The conductance summing for any one pair of row lines 66 and 68 is carried out by an associated one of the neuron circuits 70.

Figure 6:
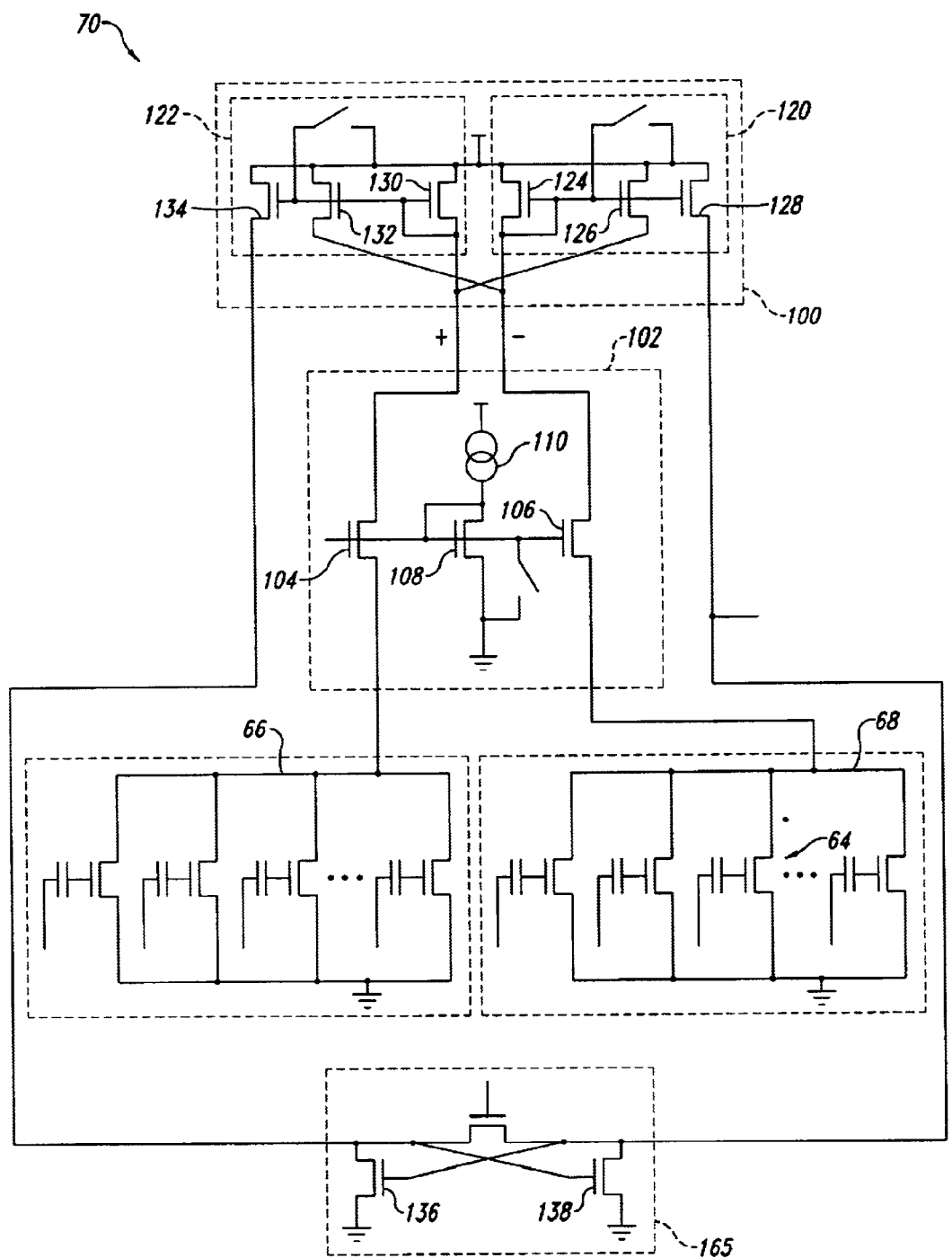
FIG. 6 is a simplified schematic diagram of a neuron for the flash memory processor of FIG. 3A, in accordance with an embodiment of the present invention.

FIG. 6 is a simplified schematic diagram of the neuron circuit 70 for the flash memory processor 60 of FIG. 3A, in accordance with an embodiment of the invention. The neuron circuit 70 includes a conductance comparator forming a neuron 100 coupled through a buffer 102 formed from two transistors 104 and 106. The buffer 102 acts to buffer synapses formed from pairs of the flash memory cells 64 coupled to each of the row lines 66 and 68.

The buffer 102 also includes a third transistor 108 having one current-carrying electrode coupled to ground, another current carrying electrode coupled to gates of all three of the transistors 104, 106 and 108 to a constant current source 110. The buffer 102 ensures that all of the flash memory cells 64 forming synapse devices operate in the triode region. As a result, the drain-source voltage of each of the flash memory cells is low (e.g., 100 millivolts) and the power required to operate the flash memory processor 60 of FIG. 3A is reduced accordingly. Further, because this drain-source voltage is both low and uniform, the data that are stored in the flash memory processor 60 cannot be read by conventional probing techniques.

The neuron 100 includes cross-coupled current mirror circuits 120 and 122 each including three transistors—124, 126 and 128 in the current mirror 120 and 130, 132 and 134 in the current mirror 122. All three transistors in each of the current mirrors 120 and 122 have commonly coupled gates and a set of commonly connected current-carrying electrodes. The transistors 124 and 130 are each diode connected. The transistors 126 and 132 each are cross coupled to the diode-connected transistor 130 and 124 in the other current mirror 122 and 120, respectively. The transistors 128 and 134 are each coupled to cross-coupled transistors 136 and 138, respectively, to provide positive feedback.

A well known output latch circuit 105 of a conventional type having cross-coupled transistors 136, 138 provides the output.

The conductance-summing convolver formed from the computation engine 60 described above provides several advantages as an authorization mechanism for transactions. These advantages include very rapid computation and low power consumption. The power consumption is reduced, compared to other flash-memory-based computation engines, at least in part because the conductance mode of operation uses the "triode region" of the operation of the floating gate FET memory cell, i.e., low source-drain voltages, rather than the saturation region using greater source-drain voltages. As a result, voltages developed in the flash memory cells 64 cannot be sensed by probing techniques such as electron beam microprobes, because these voltages are too small. Further, these voltages are all substantially similar, even when different values are being presented to the conductance-summing neuron 100 of FIG. 6.

Additionally, the reference fingerprint data stored in the flash memory array 62 of FIG. 3A are never manifested outside of the flash memory array 62. For these reasons, conductance mode computation engines 60 provide significant security advantages when these flash memory arrays 62 are used to carry out fingerprint identification in conjunction with authorization of financial transactions using smart cards or other types of electronic funds transfer.

In one embodiment, the fingerprint sensor 21 is formed on the same integrated circuit as the computation engine 25. As a result, signals developed in the computation engine 25 in response to operation of the fingerprint sensor 21 are obscured from measurement because the finger providing the fingerprint to the fingerprint sensor 21 physically blocks access to the computation engine 25. In this embodiment, the technology that is used to implement the computation engine 25 is not necessarily critical from an information security perspective. However, the fingerprint sensor 21 could still be stimulated in ways that might allow some knowledge to be gained regarding stored data in the computation engine to be obtained from the computation engine 25. For example, optical stimulation of the fingerprint sensor 40 of FIG. 2 could be used to provide a pattern by turning on some but not all of the transistors 48 and 50, and this might give some indication regarding the stored data when the computation engine 25 is one that does not operate in the conductance mode.

In another embodiment, the fingerprint sensor 21 is formed on a different integrated circuit as the computation engine 25. In this embodiment, conductance mode operation of the computation engine 25 provides several advantages. In conductance mode operation of the computation engine 60 of FIG. 3A, analog data are stored in the flash memory cells 64, but the input data and the output data are digital. In particular, the output from any one neuron 70 of FIGS. 3 and 6 is a single bit carrying only the information that either a match was or was not achieved by that neuron circuit 70. As a result, the amount of information about the stored analog data that can be learned from the digital outputs of the neurons circuits 70 is very limited.

In one embodiment, a first level of correlation detects significant features in the fingerprint, as discussed above with reference to Eqs. 1–4. The first level of correlation provides a separate correlation vector corresponding to each feature. The correlation vectors for all of the features are then input to a second correlation-based associative memory. The second associative memory determines whether or not the overall pattern of matched features corresponds to a match to stored data corresponding to an authorized fingerprint. The only externally observable variable in such as system is the match state of unobservable stored data including dummy features.

In one embodiment, the stored data representing features of authorized fingerprint data are augmented with dummy data corresponding to dummy features. Presentation of an input and monitoring the signals from the first level of correlation then does not necessarily reveal information about features of the fingerprint of the authorized user. Simply determining which features are represented by the feature data contained in the first level correlator does not provide knowledge of which of the stored data represent features that are not present in an authorized fingerprint.

As a result, the most that can be determined external to the computation engine 25 is the match state of unobservable data corresponding to the individual features including dummy data if dummy data are present. The outside observer who does not have access to the actual fingerprint has no way of discriminating between the dummy data and data corresponding to actual fingerprint features. Moreover, the overall recognition of an authorized fingerprint by the second associative memory depends on both the presence of the correct features and their relative positioning. Searching for the combination of features and relative positions with artificial inputs to the fingerprint sensor 21 of FIG. 1 is equivalent to searching for the entire fingerprint, which is computationally intensive to the point of being practically impossible.

Figure 7:
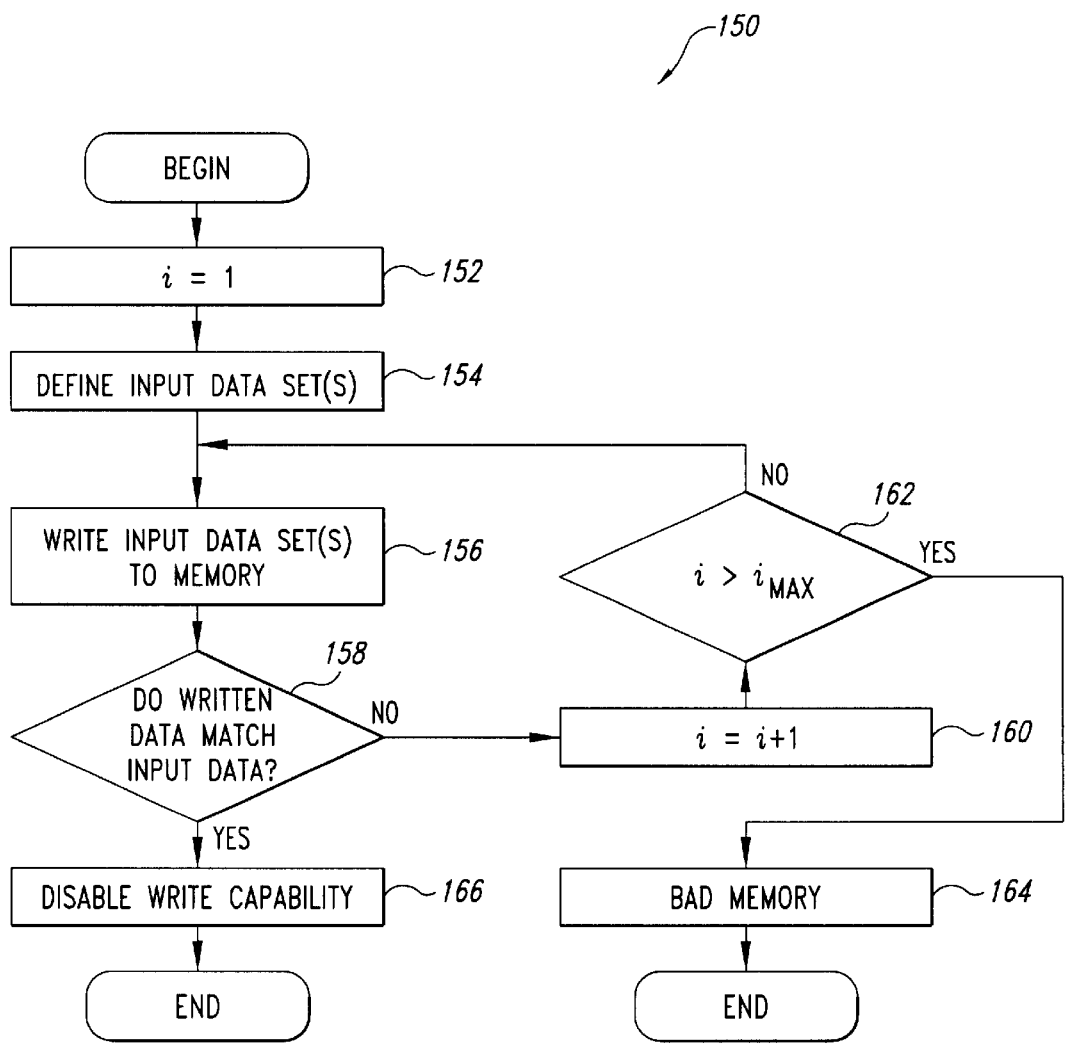
FIG. 7 is a simplified flow chart of a method of encoding data in a programmable memory, in accordance with an embodiment of the present invention.

FIG. 7 is a simplified flow chart of a method 150 of encoding data in a programmable memory, in accordance with an embodiment of the present invention. The method 150 begins by setting an index variable i to one in a step 152 when an input dataset is defined in a step 154. In one embodiment, the input dataset may be defined to be a fingerprint as sensed by a sensor such as the fingerprint sensor 21 of FIG. 1. In another embodiment, the input dataset may be defined to be more than one fingerprint, such as fingerprints from more than one finger of a single user or as fingerprints from multiple users who wish to share or be able to share use of the instrument 20.

A user whose fingertip was caught in a car door, thereby distorting relationships between minutia in the fingerprint, is in no mood to tolerate secondary malfunction of a primary resource such as a smart card. Accordingly, permitting more than one finger to be recognized is useful in promoting consumer acceptance of fingerprint access to resources that can be enabled using a smart card. Further, members of a mutual, common economic unit, e.g., spouses, may well find markedly greater convenience in a financial instrument that allows either of them to use it independently, and that facilitates transfer of resources between them.

In a step 156, the input dataset is written to a nonvolatile memory such as the memory array 62 of FIG. 3A. A query task 158 then compares data read from the memory to the input dataset to verify that the memory has actually the input dataset with sufficient integrity.

When the query task 158 determines that the input data and the data read from the memory do not match, the index variable i is incremented in a step 160. A query task 162 then determines when the index variable i exceeds a predetermined threshold $i_{MAX}$. When the query task 162 determines that the index variable i exceeds the predetermined threshold $i_{MAX}$, the memory is deemed defective in a step 164 and the process 150 ends. When the query task 162 determines that the index variable i does not exceed the predetermined threshold $i_{MAX}$, control passes back to the step 156, and the steps 156, 158, 160 and 162 are iterated until either the memory is correctly programmed or discarded.

When the query task 158 determines that the stored data match the input data, capability for writing to the memory is disabled in a step 166. In one embodiment, the capability for writing data to the memory may be disabled by destroying the functionality of write circuitry associated with the memory. In another embodiment, the capability for writing data to the memory may be disabled by decoupling the write circuitry from the memory, for example, by blowing a fuse or an antifuse coupled to the output of the write circuitry or to the memory, or by other techniques now known or that may be developed. As a result, a capability for over-writing the fingerprint data that are stored in the first flash memory or the first memory portion is disabled. This prevents someone who has a lost or stolen smart card or other secure instrument 20 from simply reprogramming the authentication portion of the secure instrument 20 with their own or an associate's authentication or fingerprint data.

Figure 8:
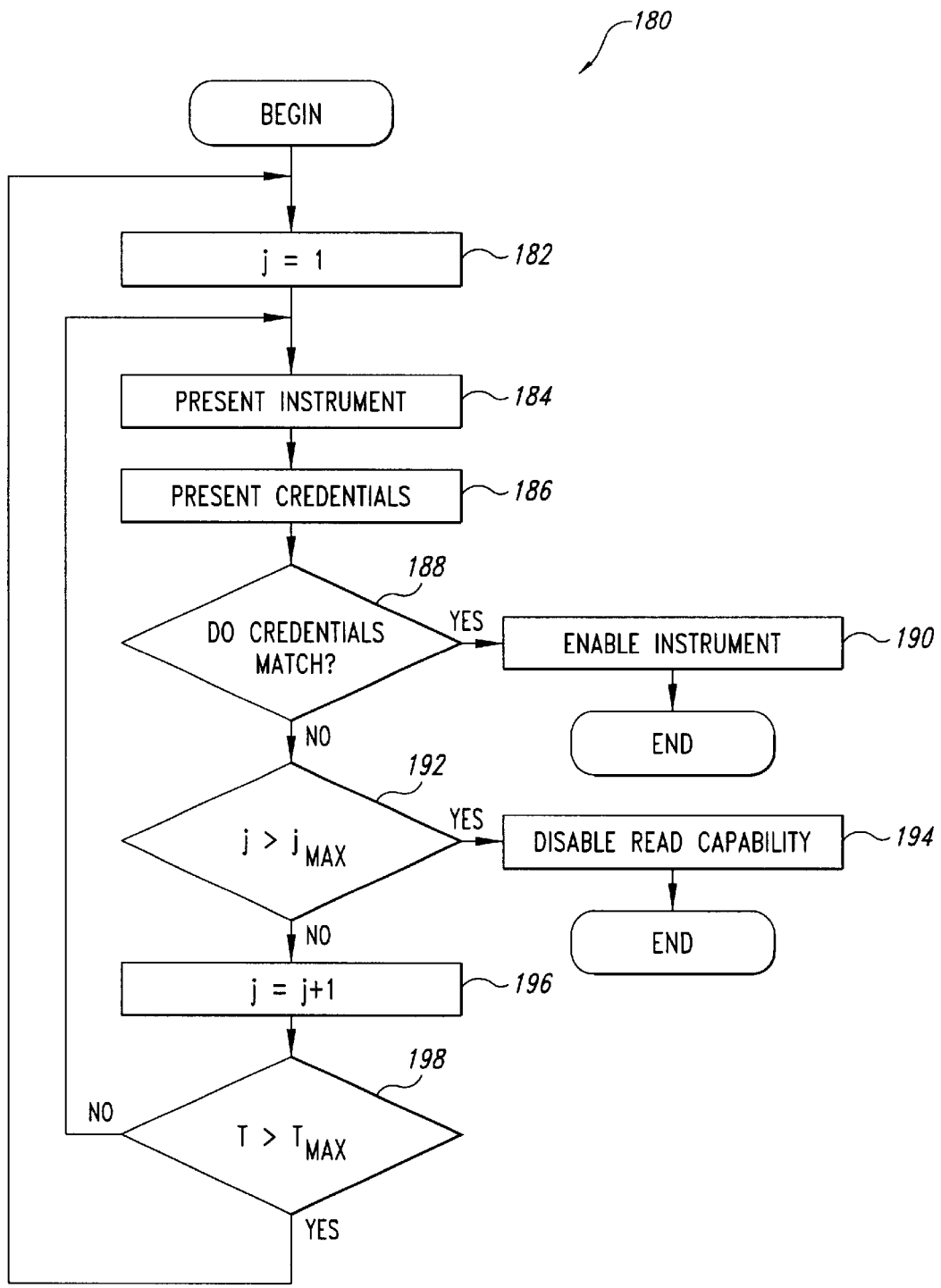
FIG. 8 is a simplified flow chart of a method of controlling access to data stored in a memory, in accordance with an embodiment of the present invention.

FIG. 8 is a simplified flow chart of a method 180 of controlling access to data stored in a memory, in accordance with an embodiment of the present invention. The method 180 begins by setting an index variable j to one in a step 182 when a user presents a financial instrument 20 (FIG. 1) in a step 184. The user also presents authorization credentials in a step 186. In one embodiment, the authorization credentials are a fingerprint and are presented by placing one of the users fingertips on the fingerprint sensor 21 of the instrument 20. In a query task 188, the computation engine 25 correlates the authorization credentials from the user with data stored in the computation engine 25 to determine if the authorization credentials match the stored data. When the authorization credentials match the stored data, the instrument 20 is enabled in a step 190, allowing transactions based on the instrument 20 or on data stored in the instrument 20 to proceed, and the process 180 ends.

When the computation engine 25 is unable to determine a match between the authorization credentials and data stored in the computation engine 25, the index variable j is compared to a predetermined threshold IMAX in a query task 192. When the query task 192 determines that the index variable j exceeds the predetermined threshold $j_{MAX}$, the read capability of the instrument 20 is disabled in a step 194 and the process 180 ends.

The read capability of the instrument 20 may be disabled in a number of different ways. In one embodiment, the fingerprint sensor 21 is disabled, disabling normal use of the instrument 20 but not destroying any financial data that may be stored in the read-write memory 28. This allows for the possibility of recovery of the instrument 20 and restoration of any remaining funds to an account belonging to the user. This capability may be significant in systems where the instrument 20 acts as the equivalent of a virtual wallet having some amount of money stored in it, which money would be lost if the instrument 20 were lost or destroyed or if the data contained in the memory 28 were lost or destroyed.

In another embodiment, the read-write circuitry associated with the computation engine 25 or the read-write memory 28 or both is disabled or destroyed. This may be carried out by severing a link between the computation engine 25 or the memory 28 by blowing a fuse or antifuse or by triggering the destruction of other circuitry necessary for accessing of these elements. The user may prefer to have all access to any stored authorization data and/or any financial data when the instrument 20 functions in a fashion similar to a credit or debit card, i.e., identifies and triggers adjustment of accounts external to the instrument 20 in carrying out a normal transaction. The authorization and financial data are then protected from theft or misuse.

When the query task 192 determines that the index variable j does not exceed the predetermined threshold $j_{MAX}$, the index variable is incremented in a step 196. An optional query task 198 then determines when a time T exceeds a predetermined threshold $t_{MAX}$. The time t is the time between initiation of a series of successive determinations by the query task 188 that the authorization credentials do not match the stored data and the present. When the query task 198 determines that the time T exceeds the predetermined threshold $t_{MAX}$, the index variable j is reset to unity in the step 182. When the query task 198 determines that the time t does not exceed the predetermined threshold $t_{MAX}$, the user may repeat presentation of the instrument in the step 184. In either case, the steps 184, 186, 188, 192, 196 and 198 may iterate until either the instrument 20 is enabled in the step 190, the instrument 20 is disabled in the step 194 or the user voluntarily ends the process 180.

By carrying out the optional query task 198, a clumsy user or a user having an instrument 20 that is marginally functional is prevented from inadvertently rendering the instrument 20 useless, without necessarily compromising the security provided by the process 180. In these situations, a few unsuccessful attempts to use the instrument 20 may be followed by a successful attempt, with the result that the instrument 20 is stored between uses. A high total count of unsuccessful attempts that may not represent attempts of unauthorized use of the instrument 20 is prevented from disabling the instrument 20. At the same time, the frequency with which an unauthorized user would have to attempt different input sequences to the fingerprint sensor 21 is very likely to result in the instrument 20 being disabled in the step 194, preserving the integrity of the instrument 20.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An integrated circuit comprising:
   a sensor that reads a fingerprint and provides data corresponding to the fingerprint; and
   a computation engine coupled to the sensor that compares the data to stored data, the computation engine enabling a smart card coupled to the computation engine when the data and the stored data match, the computation engine including,
   an array of flash memory cells arranged in pairs of rows, flash memory cells in any one row having sources coupled to a common row line;
   a plurality of conductance mode neurons each having first and second inputs coupled to first and second row lines forming a respective pair of rows; and
   a buffer circuit formed in each neuron that sets a drain-source voltage of the flash memory cells in the row pair coupled to the neuron.

2. The circuit of claim 1, further comprising:
   a controller that determines how many times the data and the stored data do not match; and
   circuitry that disables the computation engine when the number of times that the data and the stored data do not match exceeds a predetermined threshold.

3. The circuit of claim 1, wherein the computation engine disables the smart card when the data and the stored data do not match.

4. An instrument comprising:
   a sensor that reads a fingerprint and provides input data corresponding to the fingerprint;
   a computation engine coupled to the sensor that compares the input data to stored data, the computation engine including;
   an array of flash memory cells arranged in pairs of rows, flash memory cells in any one row having sources coupled to a common row line;
   a plurality of conductance mode neurons each having first and second inputs coupled to first and second row lines forming a respective pair of rows; and a buffer circuit formed in each neuron that sets a drain source voltage to cause the flash memory cells in the row pair coupled to the neuron to operate; and
   a smart card coupled to the computation engine that is enabled when the input data and the stored data match.

5. The instrument of claim 4, wherein the sensor and the computation engine are formed on a single integrated circuit.

6. The instrument of claim 4, wherein the sensor and the computation engine are formed on separate integrated circuits.

7. The integrated circuit comprising:
   a sensor that reads a fingerprint and provides data corresponding to the fingerprint; and
   a computation engine coupled to the sensor that compares the data to stored data, the computation engine enabling a smart card coupled to the computation engine when the data and the stored data match, the computation engine including,
   an array of flash memory cells arranged in pairs of rows, flash memory cells in any one row having sources coupled to a common row line;
   a plurality of conductance mode neurons each having first and second inputs coupled to first and second row lines forming a respective pair of rows; and
   a buffer circuit formed in each neuron that sets a drain-source voltage to cause the flash memory cells in the row pair coupled to the neuron to operate in the triode region.

8. An integrated circuit comprising;
   a sensor that reads a fingerprint and provides input data corresponding to the fingerprint; and
   a matrix of row and column conductors;
   a capacitor plate located at each intersection of the row and column conductors, the capacitor being coupled to the row conductor through a first transistor and to the column conductor through a second transistor; and
   sensing circuitry coupled to the matrix; and
   a computation engine coupled to the sensor that compares the data to stored data, the computation engine enabling a smart card coupled to the computation engine when the input data and the stored data match.

9. A fingerprint sensor circuit comprising:
   a matrix of row conductors and column conductors;
   a fingerprint sensing array having a sensing cell located at each intersection of the row and column conductors, the sensor cell being coupled to a row conductor and to a column conductor, the row and column conductors being selectively enabled in their electrical connection to a sensing cell in order to individually address each sensing cell;
   sensing circuitry coupled to the matrix; and
   a computation engine coupled to the sensing circuitry that compares sensed data to stored data and outputting an enable signal when the sensed data and the stored data match each other.

10. The circuit according to claim 9, wherein each sensing cell includes a capacitor plate.

11. An integrated circuit comprising:
    a sensor that reads a fingerprint and provides input data corresponding to the fingerprint;
    an array of flash memory cells arranged in pairs of rows, the flash memory cells in any one row having sources coupled to a common line;
    a plurality of conductance mode circuits each having an input coupled to a respective row of the flash memory cells;
    a buffer circuit formed in each conductance mode circuit that sets a drain-source voltage of the flash memory cells in the respective row coupled to such conductance mode circuit; and
    a computation engine that compares input data to stored data.

12. A fingerprint sensor circuit comprising:
    a matrix of row conductors and column conductors;
    a sensing cell for a fingerprint located at each intersection of the row and column conductors, each sensor cell being coupled to the row conductor through a first transistor and to the column conductor through a second transistor;
    sensing circuitry coupled to the matrix of row and column conductors; and
    a computation engine coupled to the sensing circuitry that compares input data to stored data, the computation engine outputting an enable signal when the input data matches the stored data.

13. The fingerprint sensor circuit according to claim 11, wherein the fingerprint sensor circuit is positioned on a smart card.

* * * * *